(12) United States Patent
Zhu

(10) Patent No.: US 7,842,974 B2
(45) Date of Patent: Nov. 30, 2010

(54) GALLIUM NITRIDE HETEROJUNCTION SCHOTTKY DIODE

(75) Inventor: TingGang Zhu, Cupertino, CA (US)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 0 days.

(21) Appl. No.: 12/388,390

(22) Filed: Feb. 18, 2009

(65) Prior Publication Data

US 2010/0207166 A1 Aug. 19, 2010

(51) Int. Cl.
*H01L 29/47* (2006.01)
(52) U.S. Cl. ............... 257/201; 257/471; 257/472
(58) Field of Classification Search ......... 257/201, 257/471, 472
See application file for complete search history.

(56) References Cited

U.S. PATENT DOCUMENTS

| | | | |
|---|---|---|---|
| 7,229,866 B2 | 6/2007 | Zhu et al. | |
| 7,372,080 B2 | 5/2008 | Goto et al. | |
| 7,436,039 B2 | 10/2008 | Zhu et al. | |
| 2006/0108659 A1 | 5/2006 | Yanagihara et al. | |
| 2007/0210335 A1* | 9/2007 | Ikeda et al. ............. | 257/201 |
| 2008/0142837 A1 | 6/2008 | Sato et al. | |
| 2009/0200576 A1* | 8/2009 | Saito et al. ............. | 257/194 |
| 2010/0075082 A1* | 3/2010 | Komada et al. .......... | 428/35.7 |

OTHER PUBLICATIONS

Z. Z. Bandić et al., "High voltage (450 V) GaN schottky rectifiers," Applied Physics Letters, vol. 74, No. 9, Mar. 1, 1999, pp. 1266-1268.
Seiko Yoshida et al., "A New GaN Based Field Effect Schottky Barrier Diode with a Very Low On-Voltage Operation," Proceedings of 2004 International Symposium on Power Semiconductor Devices & ICs, Kitakyushu, pp. 323-326.
T. G. Zhu et al., "High-voltage mesa-structure GaN Schottky rectifiers processed by dry and wet etching," Applied Physics Letters, vol. 77, No. 18, Oct. 30, 2000, pp. 2918-2920.

* cited by examiner

*Primary Examiner*—Long Pham
(74) *Attorney, Agent, or Firm*—Patent Law Group LLP; Carmen C. Cook

(57) ABSTRACT

A gallium nitride based semiconductor diode includes a substrate, a GaN layer formed on the substrate, an AlGaN layer formed on the GaN layer where the GaN layer and the AlGaN layer forms a cathode region of the diode, a metal layer formed on the AlGaN layer forming a Schottky junction therewith where the metal layer forms an anode electrode of the diode, and a high barrier region formed in the top surface of the AlGaN layer and positioned under an edge of the metal layer. The high barrier region has a higher bandgap energy than the AlGaN layer or being more resistive than the AlGaN layer.

14 Claims, 8 Drawing Sheets

GALLIUM NITRIDE HETEROJUNCTION SCHOTTKY DIODE

FIELD OF THE INVENTION

The invention relates to gallium nitride heterojunction semiconductor devices and, in particular, to gallium nitride (GaN) heterojunction Schottky diodes with increased reverse bias breakdown voltage.

DESCRIPTION OF THE RELATED ART

A Schottky diode is a semiconductor device formed by a metal contacting a semiconductor layer. The junction between the metal and the semiconductor layer forms a rectifying junction with improved diode switching capability as compared to p-n junction diodes formed entirely in a semiconductor layer. Schottky diodes thus have lower turn-on voltages and faster switching speeds as compared to p-n junction diodes. Schottky diodes are ideal for applications where switching loss is the major source of energy consumption, such as in switch-mode power supplies (SMPS).

Electronic devices made from nitride-based compound semiconductor materials are known. Such electronic devices are also known as III-Nitride semiconductor devices as being formed from Group III nitride based materials. Nitride-based compound semiconductor devices are desirable for their wider band gap and higher breakdown voltage characteristics, rendering them suitable for high voltage and high temperature applications. In particular, III-V gallium nitride (GaN) compound semiconductor Schottky diodes having a high breakdown voltage and a low on-resistance have been described. The efficiency of switch-mode power supplies can be improved through the use of III-Nitride semiconductor Schottky barrier diodes.

Nitride-based compound semiconductor devices formed using a heterojunction structure are also known. For instance, GaN Schottky diodes formed using an AlGaN heterojunction has been described. In an AlGaN heterojunction Schottky diode, an AlGaN layer is formed over a GaN layer to form the cathode region of the Schottky diode. The AlGaN layer has a larger band gap than the underlying GaN layer and a two-dimensional electron gas is generated at the heterostructure interface. The two-dimensional electron gas is a layer with high electron mobility and thus very small electric resistance. Accordingly, an AlGaN heterojunction Schottky diode has significantly lower on-resistance than devices without the two-dimensional electron gas layer.

U.S. Patent Publication No. 2007/0210335 A1 to Ikeda et al. describes a GaN semiconductor device using a composite anode with two different anode metals where the first anode electrode has a Schottky barrier height relatively lower than the second anode electrode. FIG. 1 duplicates FIG. 1 of Ikeda et al. and illustrates the composite anode electrode 17 as including a first anode electrode 17A and a second anode electrode 17B. Ikeda et al. further describe a GaN semiconductor device where a layer of III-V nitride semiconductor having a smaller band gap energy than the surrounding cathode material is formed in the upper layer of the cathode in contact with the first anode electrode. The GaN semiconductor device of Ikeda et al. has a low on-resistance and a small leak current when a reverse bias voltage is applied and concentration of electric field between the anode electrode and the cathode electrode is suppressed.

A nitride-based compound semiconductor Schottky diode with high breakdown voltage characteristics for high voltage application is desired.

SUMMARY OF THE INVENTION

According to one embodiment of the present invention, a gallium nitride based semiconductor diode includes a substrate, a GaN layer formed on the substrate, an AlGaN layer formed on the GaN layer where the GaN layer and the AlGaN layer forms a cathode region of the diode, a metal layer formed on the AlGaN layer forming a Schottky junction therewith where the metal layer forms an anode electrode of the diode, and a high barrier region formed in the top surface of the AlGaN layer and positioned under an edge of the metal layer. The high barrier region has a higher bandgap energy than the AlGaN layer or being more resistive than the AlGaN layer.

In one embodiment, the gallium nitride based semiconductor diode further includes a dielectric layer formed on the AlGaN layer where the dielectric layer has an opening in which the metal layer is formed as the anode electrode. In another embodiment, a field plate structure is formed in the dielectric layer and surrounds the metal layer at an metal layer to AlGaN layer interface. The field plate structure includes an extension of the dielectric layer at reduced thickness where the field plate structure extends into the metal layer at the metal layer to AlGaN layer interface.

The present invention is better understood upon consideration of the detailed description below and the accompanying drawings.

DETAILED DESCRIPTION OF THE PREFERRED EMBODIMENTS

In accordance with the principles of the present invention, a nitride-based compound semiconductor heterojunction Schottky diode ("nitride-based Schottky diode") includes high barrier regions formed in the compound semiconductor cathode region surrounding the edge of the anode electrode. The high barrier regions are formed using a material that has a higher Schottky barrier height or higher bandgap energy or that is more resistive than the nitride-based compound semiconductor material of the cathode region. In this manner, electric field crowding at the edge of the anode electrode is suppressed by redistributing the electric field at the region and the breakdown voltage of the Schottky diode device is increased. In another embodiment, dielectric field plate structures are formed at the anode contact opening to spread out the electric field at the edge of the anode electrode, thereby reducing the concentration of electric field at the anode electrode edge.

When a nitride-based compound semiconductor heterojunction Schottky diode incorporates the high barrier regions or the dielectric field plate structures, the Schottky diode thus formed achieves low on-resistance during forward conduction and high breakdown voltage under reverse bias. The nitride-based Schottky diode can be advantageously applied in high voltage applications such as switch mode power supplies for limiting the switching loss and increasing the efficiency of the switch mode power supplies.

In the following description, nitride-based compound semiconductor heterojunction Schottky diodes are formed using a gallium-nitride (GaN) and aluminum-gallium-nitride (AlGaN) heterostructure and the Schottky diodes thus formed are sometimes referred to as "GaN Schottky diodes". However, the use of GaN and AlGaN as the nitride-based semiconductor heterostructure is illustrative only and the nitride-based compound semiconductor heterojunction Schottky diode of the present invention can be formed using other III-V compound semiconductor materials, presently known or to be developed.

Figure 1:
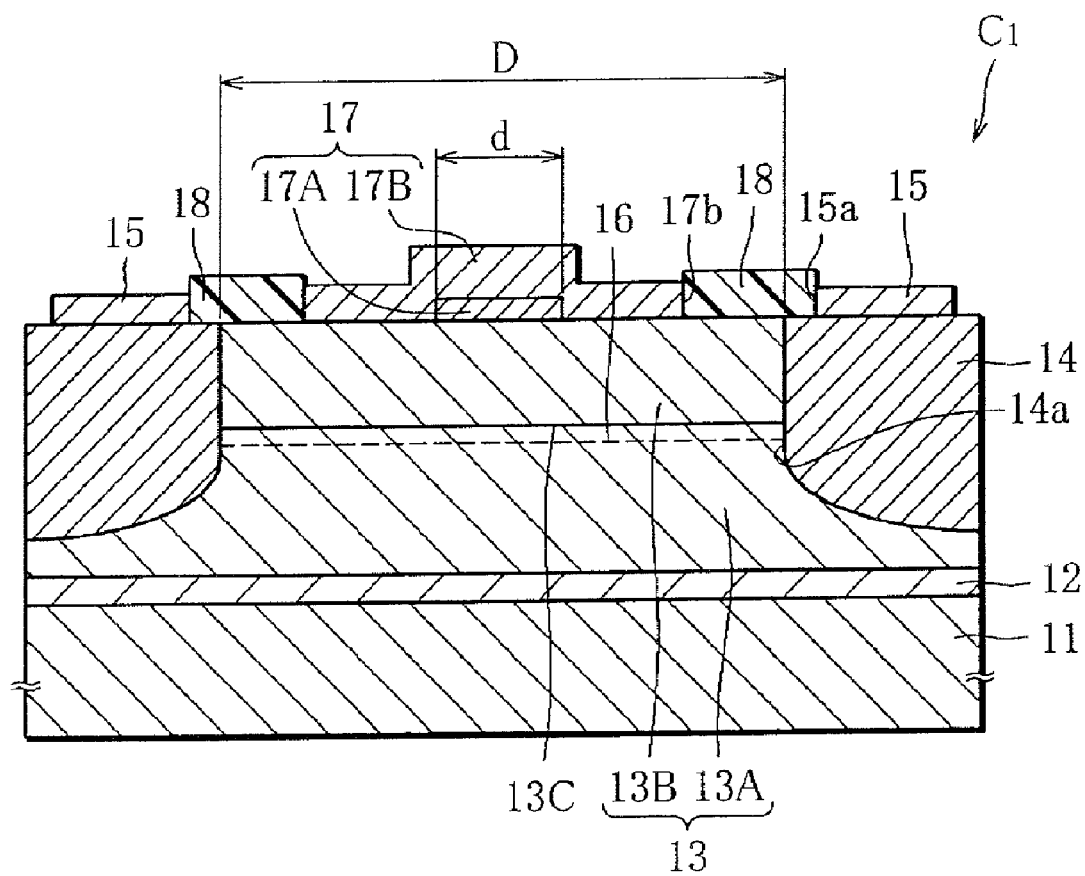
FIG. 1 duplicates FIG. 1 of U.S. Patent Publication No. 2007/0210335 A1 and illustrates a GaN semiconductor device using a composite anode structure.
Figure 2:
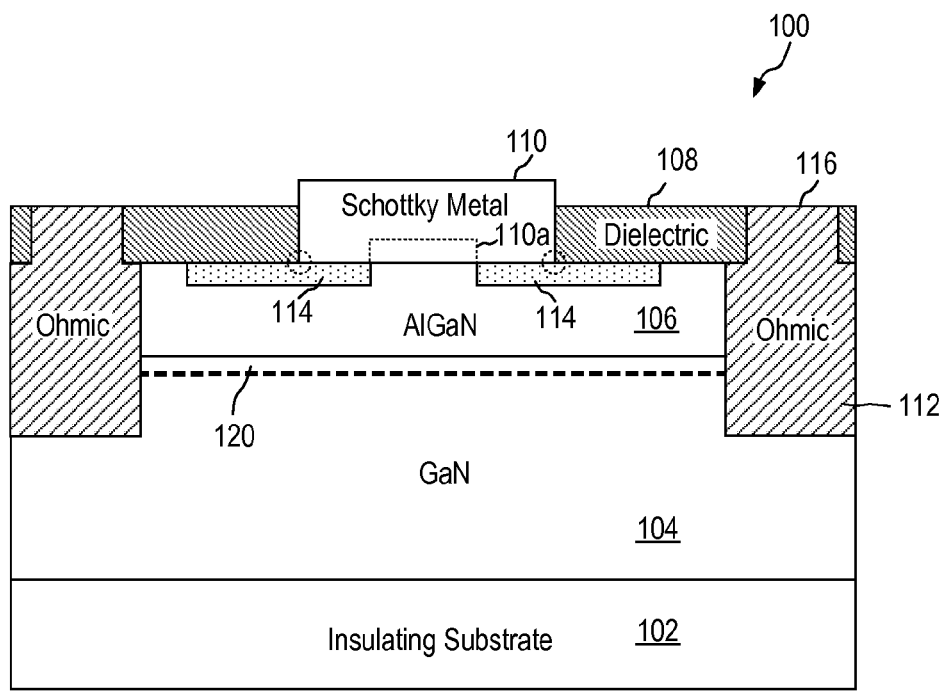
FIG. 2 is a cross-sectional view of a GaN heterojunction Schottky diode according to a first embodiment of the present invention.

FIG. 2 is a cross-sectional view of a GaN heterojunction Schottky diode according to a first embodiment of the present invention. Referring to FIG. 2, a GaN Schottky diode 100 is formed on an insulating substrate 102. The insulating substrate 102 can be formed from a material selected from sapphire, ZnO, AlN, GaN, semi-insulating SiC or glass. GaN Schottky diode 100 includes at least one heterostructure of III-nitride semiconductors having different bandgap energies forming the cathode region of the GaN Schottky diode. In the present embodiment, a GaN layer 104 is formed on the insulating substrate 102 and an AlGaN layer 106 is formed on the GaN layer 104. The AlGaN layer 106 has a larger band gap than the underlying GaN layer 104 and two-dimensional electron gas is generated at the heterostructure interface (region 120). The two-dimensional electron gas is a layer with high electron mobility and thus very small electrical resistance.

Ohmic contacts 112 to the cathode region of the Schottky diode 100 are provided to form a cathode electrode and the ohmic contacts 112 are formed sufficiently deep to be in electrical contact with the 2-dimensional electron gas region 120. Then, the GaN/AlGaN heterostructure is covered with a dielectric layer 108 with openings for the cathode electrode 116 and also an opening for the anode electrode. A layer of Schottky metal 110 is formed in the anode electrode opening in the dielectric layer 108 to be in contact with the AlGaN layer 106. A Schottky junction is formed at the interface between the Schottky metal layer 110 and the AlGaN layer 106. It is well understood that electric field crowding occurs at the edges of Schottky metal layer 110, denoted by dotted circles in FIG. 2.

According to one embodiment of the present invention, the GaN Schottky diode 100 includes one or more high barrier regions 114 formed in the top surface of the cathode region of the Schottky diode and positioned at the edges of the anode electrode. High barrier regions 114 are formed of a material capable of handling high electric field. The high barrier regions 114 are placed at locations of the anode electrode where high concentration of electric field usually exists to suppress the electric field crowding. In the present embodiment, the high barrier regions 114 are formed in the top surface of the AlGaN layer 106 of Schottky diode 100.

In one embodiment, high barrier regions 114 are formed of a material with a wider bandgap than the compound semiconductor material in the surrounding cathode region. That is, high barrier regions 114 are formed of a material with a wider bandgap than the AlGaN semiconductor layer. Thus, high barrier regions 114 forms a higher Schottky barrier when interfaced with Schottky metal layer 110. In this manner, electric field crowding at the anode electrode edges is suppressed. In another embodiment, high barrier regions 114 is formed of a material that is more resistive than the compound semiconductor material in the surrounding cathode region. The increased resistivity of the high barrier regions 114 reduces the concentration of electric field at the anode electrode edge. High barrier regions 114 can be formed by ion implantation, diffusion, trench and refill/re-growth, as will be described in more detail below.

Region 110a in Schottky metal layer 110 is a Schottky metal layer that is the same as or different from Schottky metal layer 110. Region 110a is formed to facilitate a self-aligned method for forming high barrier regions 114, as will be described in more detail below. When region 110a is formed using a different Schottky metal than that of Schottky metal layer 110, region 110a is typically forming using a Schottky metal with a lower Schottky barrier height than Schottky metal layer 110. The anode electrode structure, whether formed using a single metal or formed as a composite structure, is not critical to the practice of the present invention. Region 110a is optional and may be omitted when other fabrication methods are used.

Figure 3:
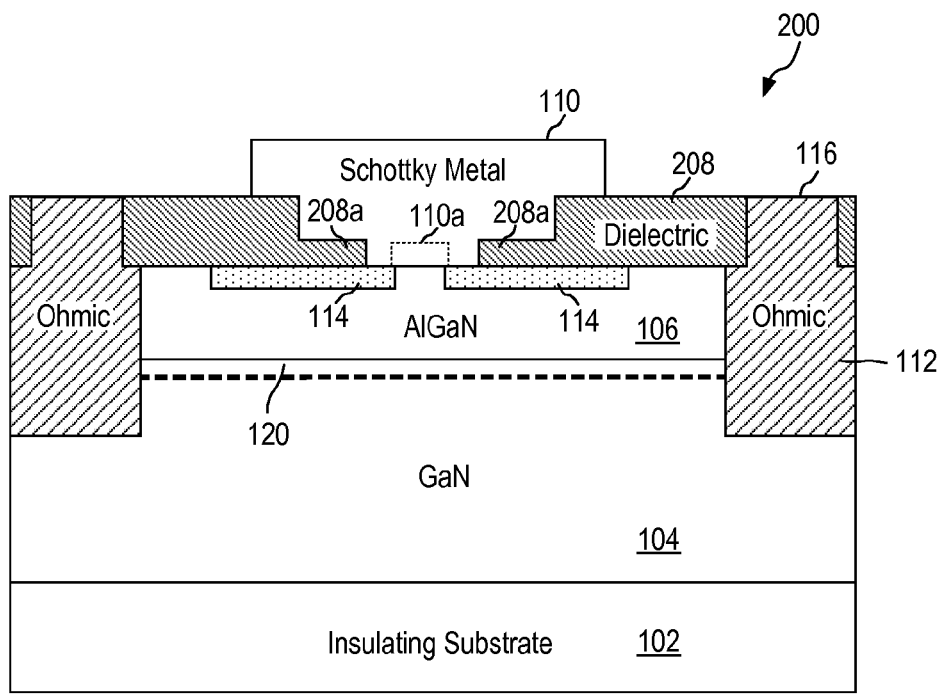
FIG. 3 is a cross-sectional view of a GaN heterojunction Schottky diode according to a second embodiment of the present invention.

FIG. 3 is a cross-sectional view of a GaN heterojunction Schottky diode according to a second embodiment of the present invention. FIG. 3 illustrates another method for suppressing electric field crowding at the anode electrode edge of a GaN Schottky diode where field plate structures are used in addition to high barrier regions. Referring to FIG. 3, a GaN Schottky diode 200 is formed in the same manner as GaN Schottky diode 100 and like elements are given like reference numerals and will not be further described. GaN Schottky diode 200 are formed using a dielectric layer 208 which is patterned to include field plate structures 208a. Field plate structures 208a are an extension of the dielectric layer and is patterned to be thinner than the dielectric layer 208 and extends into the Schottky metal to AlGaN layer interface. Field plate structures 208a operate to spread out the electric field that may be concentrated near the edges of the anode electrode. By providing field plate structures 208a at the anode electrode ledge, electric field crowding at the edge of the anode electrode is suppressed.

As described above with reference to FIG. 2, region 110a in Schottky metal layer 110 is formed to facilitate a self-aligned method for forming high barrier regions 114, as will be described in more detail below. Region 110a is optional and may be omitted when other fabrication methods are used.

Figure 4:
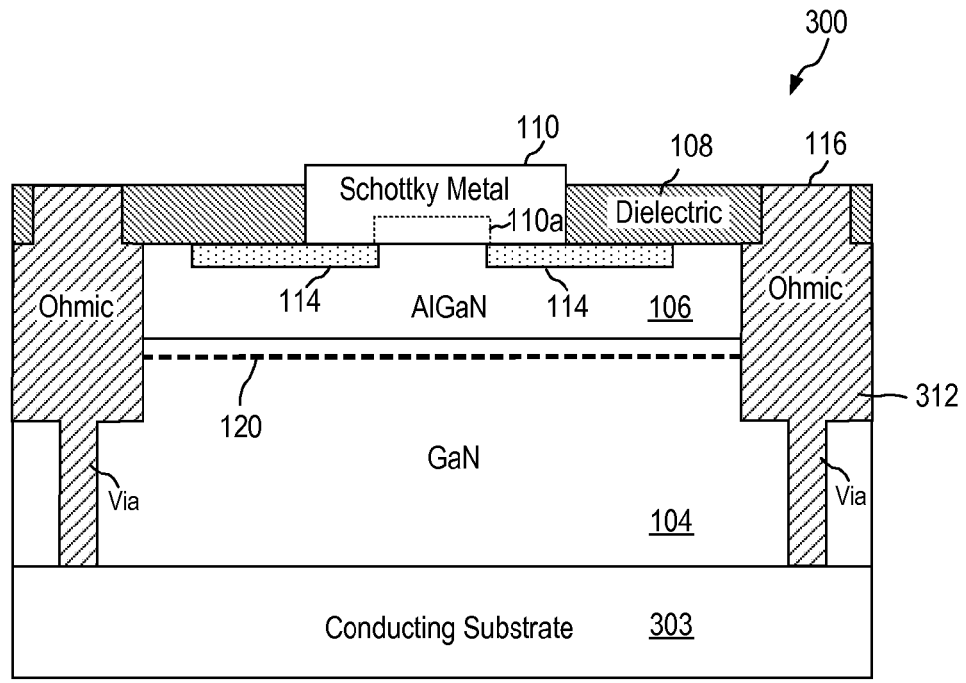
FIG. 4 is a cross-sectional view of a GaN heterojunction Schottky diode according to a third embodiment of the present invention.

In the embodiments shown in FIGS. 2 and 3, the GaN Schottky diodes are formed on an insulating substrate. In other embodiments, the GaN Schottky diodes are formed on conducting substrate, such as silicon and SiC. FIG. 4 is a cross-sectional view of a GaN heterojunction Schottky diode according to a third embodiment of the present invention. Referring to FIG. 4, a GaN Schottky diode 300 is formed in the same manner as GaN Schottky diode 100 and like elements are given like reference numerals and will not be further described. In the present embodiment, GaN Schottky diode 300 is formed on a conducting substrate 303. When a conducting substrate is used, a via structure 312 is formed to establish an ohmic contact to the conducting substrate 303. GaN Schottky diode 300 includes high barrier regions 114 for suppressing electric field crowding at the edges of the anode electrode.

Figure 5:
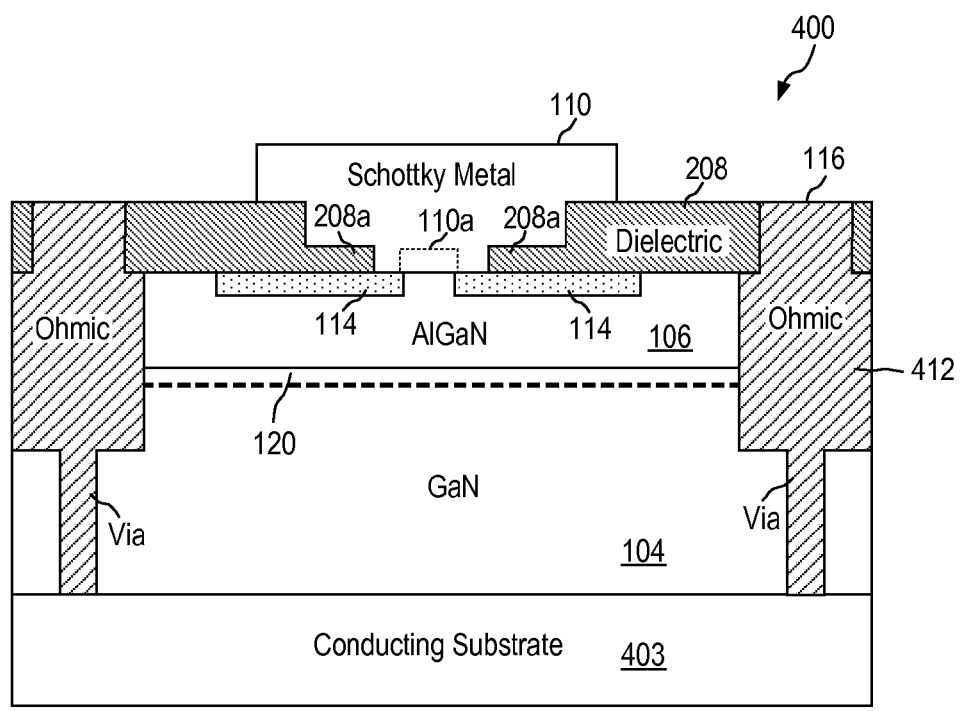
FIG. 5 is a cross-sectional view of a GaN heterojunction Schottky diode according to a fourth embodiment of the present invention.

FIG. 5 is a cross-sectional view of a GaN heterojunction Schottky diode according to a fourth embodiment of the present invention. Referring to FIG. 5, a GaN Schottky diode 400 is formed in the same manner as GaN Schottky diode 200 and like elements are given like reference numerals and will not be further described. GaN Schottky diode 400 is formed on a conducting substrate 403. When a conducting substrate is used, a via structure 412 is formed to establish an ohmic contact to the conducting substrate 403. GaN Schottky diode 400 includes high barrier regions 114 and field plate structures 208a for suppressing electric field crowding at the edges of the anode electrode.

Figure 6:
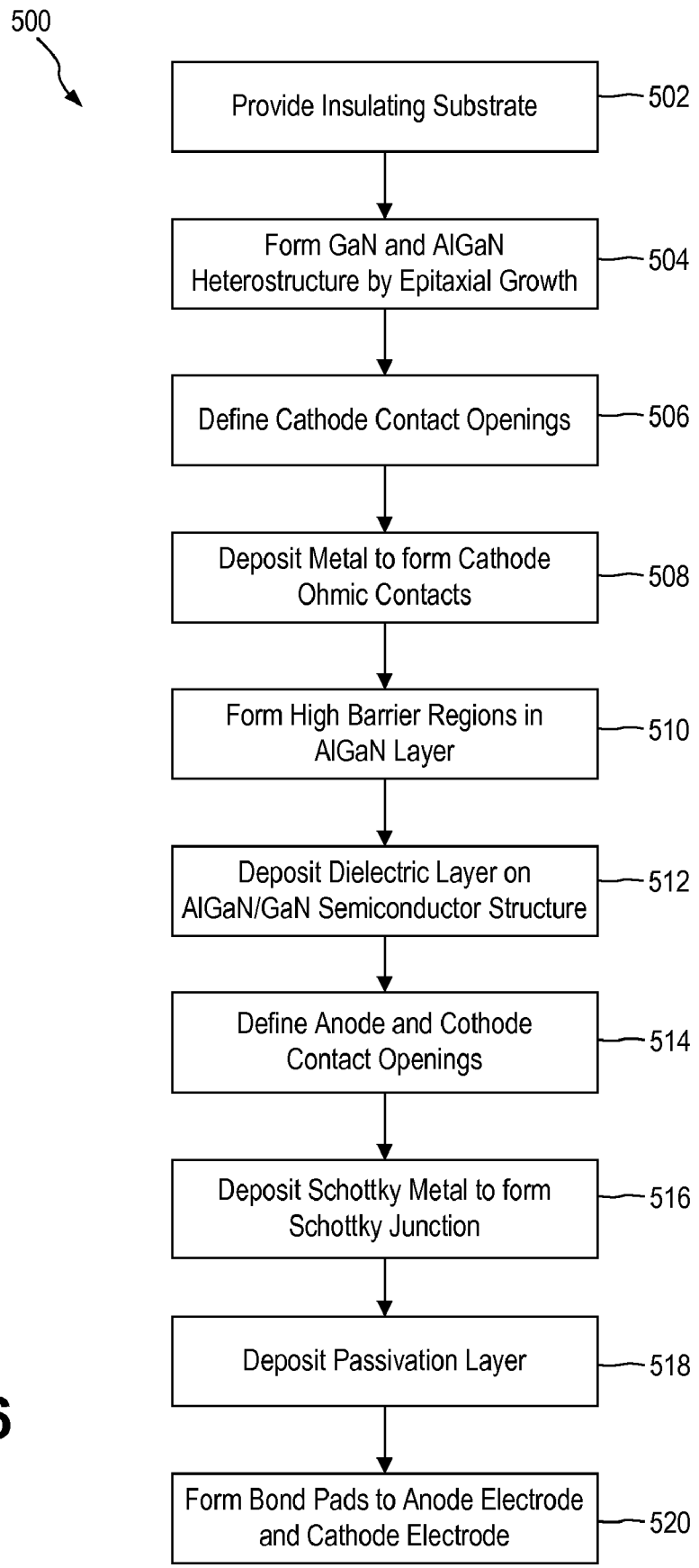
FIG. 6 is a flow chart illustrating the fabrication process for fabricating the GaN heterojunction Schottky diode of FIG. 2 according to one embodiment of the present invention.

FIG. 6 is a flow chart illustrating the fabrication process for fabricating the GaN heterojunction Schottky diode of FIG. 2 according to one embodiment of the present invention. Referring to FIG. 6 and FIG. 2, method 500 starts with providing an insulating substrate 102 (step 502). Then, a III-V compound semiconductor heterostructure is formed on the insulating substrate, such as by epitaxial growth (step 504). In the present embodiment, GaN layer 104 and AlGaN layer 106 are grown epitaxially on insulating substrate 102. Then, cathode contact openings are defined in the GaN layer and the AlGaN layer (step 506). Metal deposition is carried out to form cathode ohmic contact 112 in the cathode contact openings (step 508).

With the AlGaN/GaN heterostructure thus formed, high barrier regions 114 are then formed on the top surface of the AlGaN layer 106 (step 510). The high barrier regions 114 can be formed using different fabrication methods. FIGS. 9-13 illustrate three different methods which can be used to form the high barrier regions according to different embodiments of the present invention.

Figure 9:
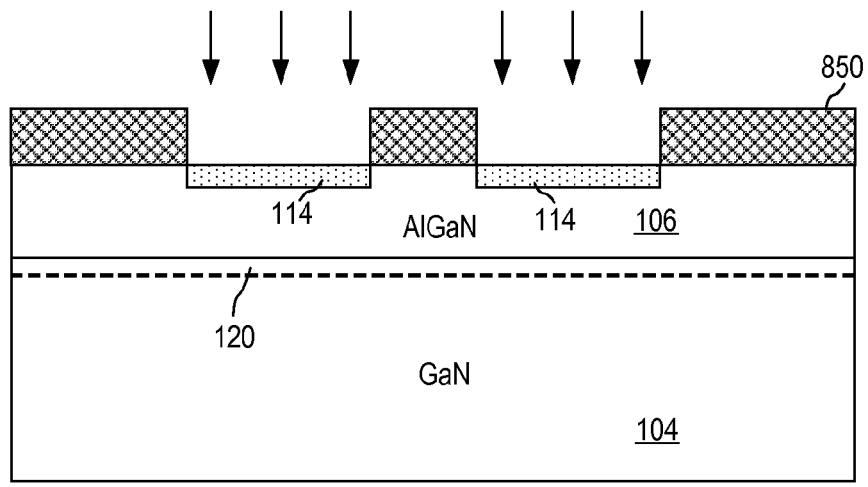
FIG. 9 is a cross-sectional view of a GaN heterojunction Schottky diode at an intermediate step of the fabrication process illustrating the formation of the high barrier regions according to a first embodiment of the present invention.

Referring to FIG. 9, in a first method for forming the high barrier regions, a dielectric layer 850 serving as mask is deposited on the AlGaN/GaN heterostructure and is patterned to define openings where the high barrier regions 114 are to be formed. Then, ion implantation or diffusion or plasma exposure is carried out to convert the exposed areas into regions with higher bandgap energy or with higher resistivity. In one embodiment, the high barrier regions 114 are implanted using type II material—Mg, Cd, Ca or Zn. In another embodiment, the high barrier regions 114 are implanted using insulating material such as O, N, Ar, or C. After the high barrier regions are formed, the dielectric masking layer 850 is removed and subsequent processing steps in method 500 are carried out.

Figure 10:
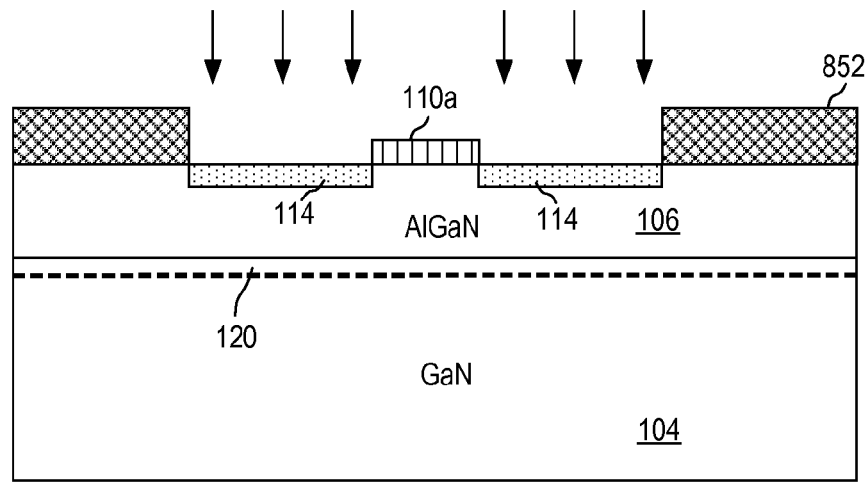
FIG. 10 is a cross-sectional view of a GaN heterojunction Schottky diode at an intermediate step of the fabrication process illustrating the formation of the high barrier regions according to a second embodiment of the present invention.

Turning to FIG. 10, in a second method for forming the high barrier regions, a dielectric masking layer 852 defines the outer boundary of the high barrier regions, then a Schottky metal layer is deposited and patterned to form Schottky metal region 110a defining the inner boundary of the high barrier regions. Schottky metal region 110a also forms the Schottky junction with the underlying AlGaN layer 106. After formation of the Schottky metal region 110a, exposed areas of the AlGaN layer 106 are subject to ion implantation, diffusion or plasma exposure to convert the exposed areas into high barrier regions 114.

Figure 11:
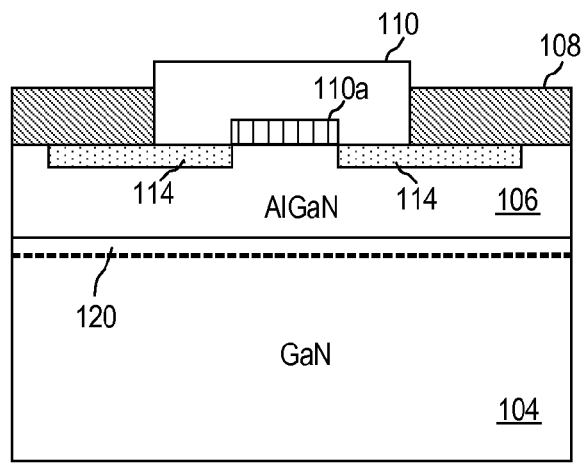
FIG. 11 is a cross-sectional view of a GaN heterojunction Schottky diode with high barrier regions formed using the anode metal structure of FIG. 10 according to one embodiment of the present invention.

In the method shown in FIG. 10, the edges of the high barrier regions 114 are self-aligned to Schottky metal region 110a. Thus, Schottky metal region 110a functions as a mask to facilitate the self-alignment of the high barrier regions 114. FIG. 11 illustrates the subsequent processing steps where the Schottky metal layer 110 is formed on top of Schottky metal region 110a. The edges of Schottky metal region 110, being the edges of the anode electrode, are positioned within the high barrier regions 114 so that the high barrier regions act to suppress the electric field crowding at the anode electrode edges.

In one embodiment, Schottky metal region 110a and Schottky metal 110 are formed using the same Schottky metal materials. Thus, Schottky metal region 110a merges into Schottky metal 110 in the final anode electrode structure. In another embodiment, Schottky metal region 110a and Schottky metal 110 are formed using different Schottky metal materials. In that case, a composite anode electrode is formed and Schottky metal region 110a is typically formed using a Schottky metal that has a lower Schottky barrier height than Schottky metal 110.

Figure 12:
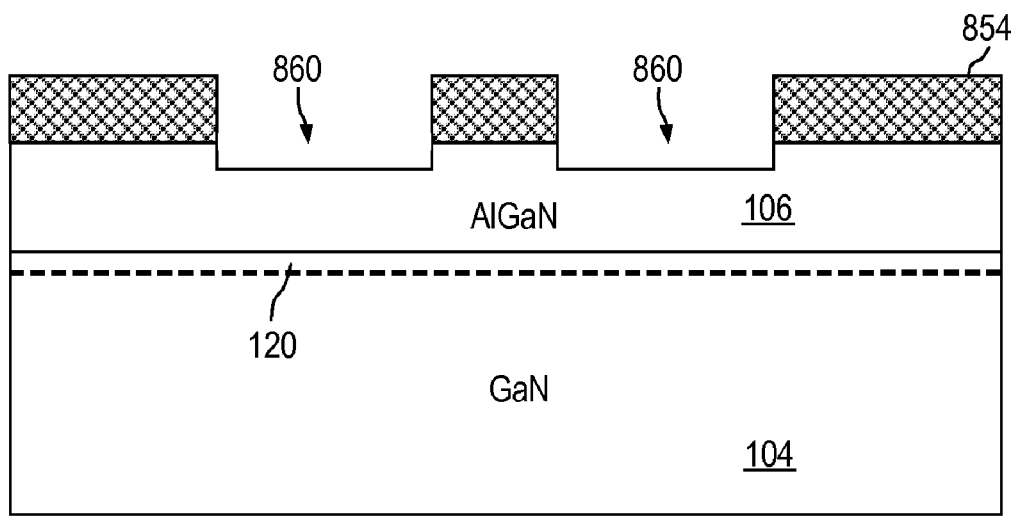
FIG. 12 is a cross-sectional view of a GaN heterojunction Schottky diode at an intermediate step of the fabrication process illustrating the formation of the high barrier regions according to a third embodiment of the present invention.
Figure 13:
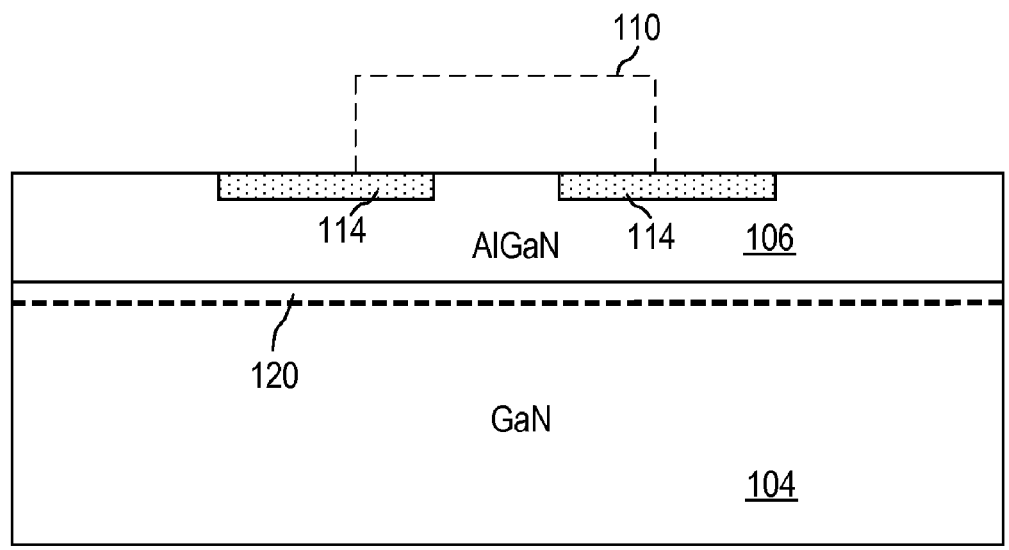
FIG. 13 is a cross-sectional view of a GaN heterojunction Schottky diode with high barrier regions formed using the trench and fill method of FIG. 12 according to one embodiment of the present invention.

Turning now to FIG. 12, in a third method for forming the high barrier regions, a mask 854 is applied and patterned to define areas where the high barrier regions are to be formed. Then, an etching process is carried out to form trenches 860 in the exposed areas. The trenches are then refilled either by deposition or by regrowth to form the high barrier regions 114 (FIG. 13). In one embodiment, the trenches 860 are filled with an oxide layer which has a very high bandgap as compared to the AlGaN layer and thus suitable for use as an electric field suppressor. The mask 854 is then removed and the AlGaN/GaN structure is subjected to subsequent processing in method 500. The dotted box in FIG. 13 represents the location of the Schottky metal layer 110 formed in subsequent processing.

Returning to FIG. 6 and FIG. 2, after the high barrier regions are formed in the AlGaN layer (step 510), method 500 proceeds to deposit a dielectric layer 108 on the AlGaN/GaN semiconductor structure (step 512). The dielectric layer 108 is patterned to define openings for the cathode electrode and for the anode electrode (step 514). Schottky metal 110 is deposited in the anode electrode opening to form a Schottky junction with the underlying AlGaN layer 106 (step 516). Subsequently, a passivation layer is deposited over the entire device to passivate the finished structure (step 518). Openings in the passivation layer are made to form bond pads to the anode and cathode electrodes to allow external connection to the GaN Schottky diode (step 520). The passivation layer and the bond pads are not shown in FIG. 2.

Figure 7:
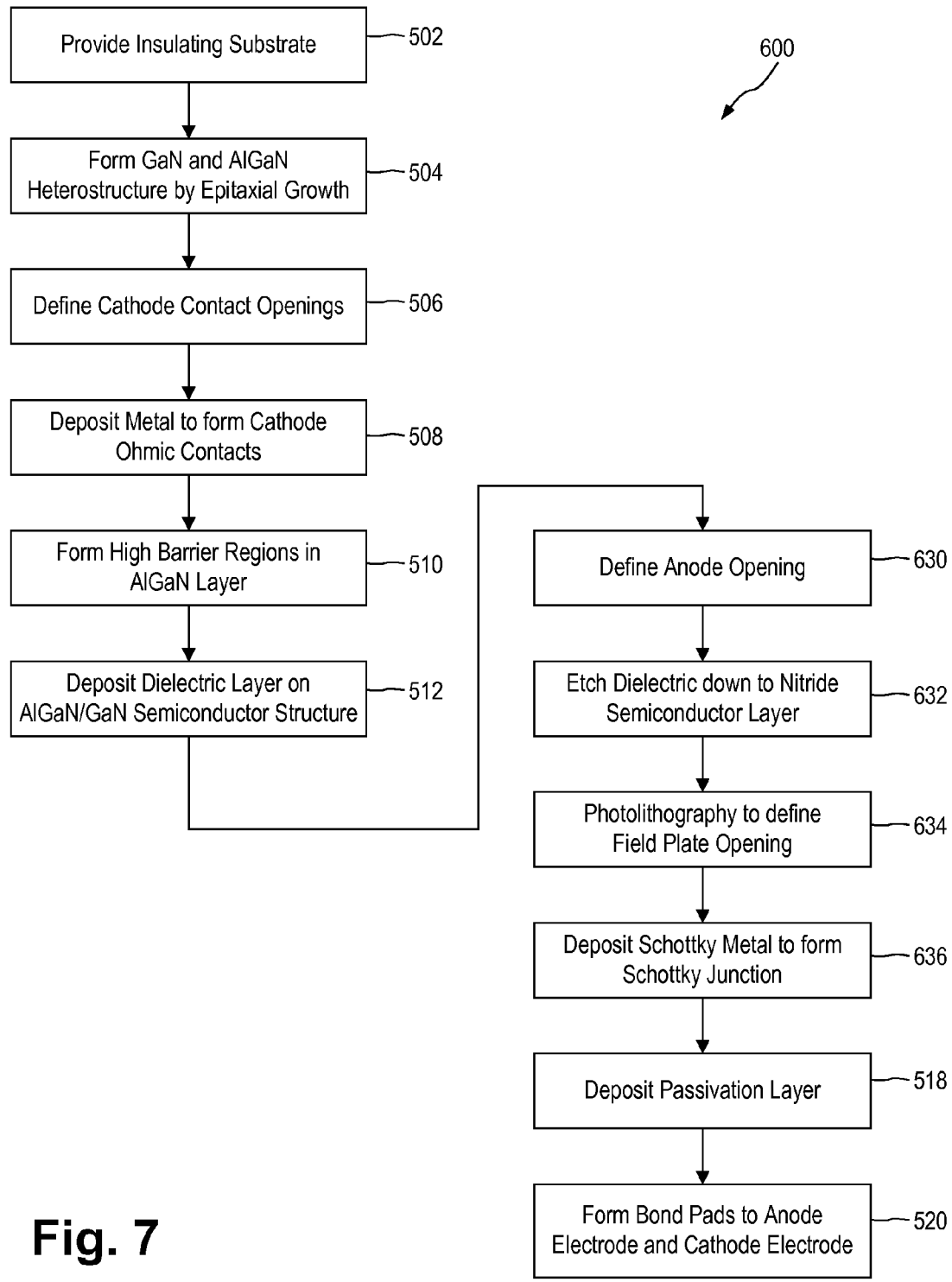
FIG. 7 is a flow chart illustrating the fabrication process for forming field plate structures in the GaN heterojunction Schottky diode of FIGS. 3 and 5 according to one embodiment of the present invention.

In the case where field plate structures are used in addition to the high barrier regions, such as in GaN diode 200 of FIG. 3, method 600 in FIG. 7 can be used to form the field plate structures 208a according to one embodiment of the present invention. When field plate structures 208a are desired, steps 502 to 512, as described above with reference to method 500 are carried out. At step 512, a dielectric layer is deposited on the GaN/AlGaN semiconductor structure. Method 600 continues by defining the anode opening in the dielectric layer (step 630). The dielectric layer is then etched down to the nitride semicondcutor layer (step 632). Then, a photolithography process is carried out to define the field plate opening (step 634). That is, a layer of photoresist is deposited on the dielectric layer and the nitride semiconductor structure. The photoresist layer is patterned and developed to expose the field plate opening. Then, an etch process is carried out to etch the dielectric layer so that field plates 208a are formed outside of the anode opening.

Subsequently, Schottky metal 110 is deposited in the anode electrode opening to form a Schottky junction with the underlying AlGaN layer 106 (step 636). Then, a passivation layer is deposited over the entire device to passivate the finished structure (step 518). Openings in the passivation layer are made to form bond pads to the anode and cathode electrodes to allow external connection to the GaN Schottky diode (step 520). The passivation layer and the bond pads are not shown in FIG. 2.

Method 600 thus form a GaN Schottky diode with high barrier regions and field plates to redistribute the electric field around the edge of the anode electrode.

Figure 8:
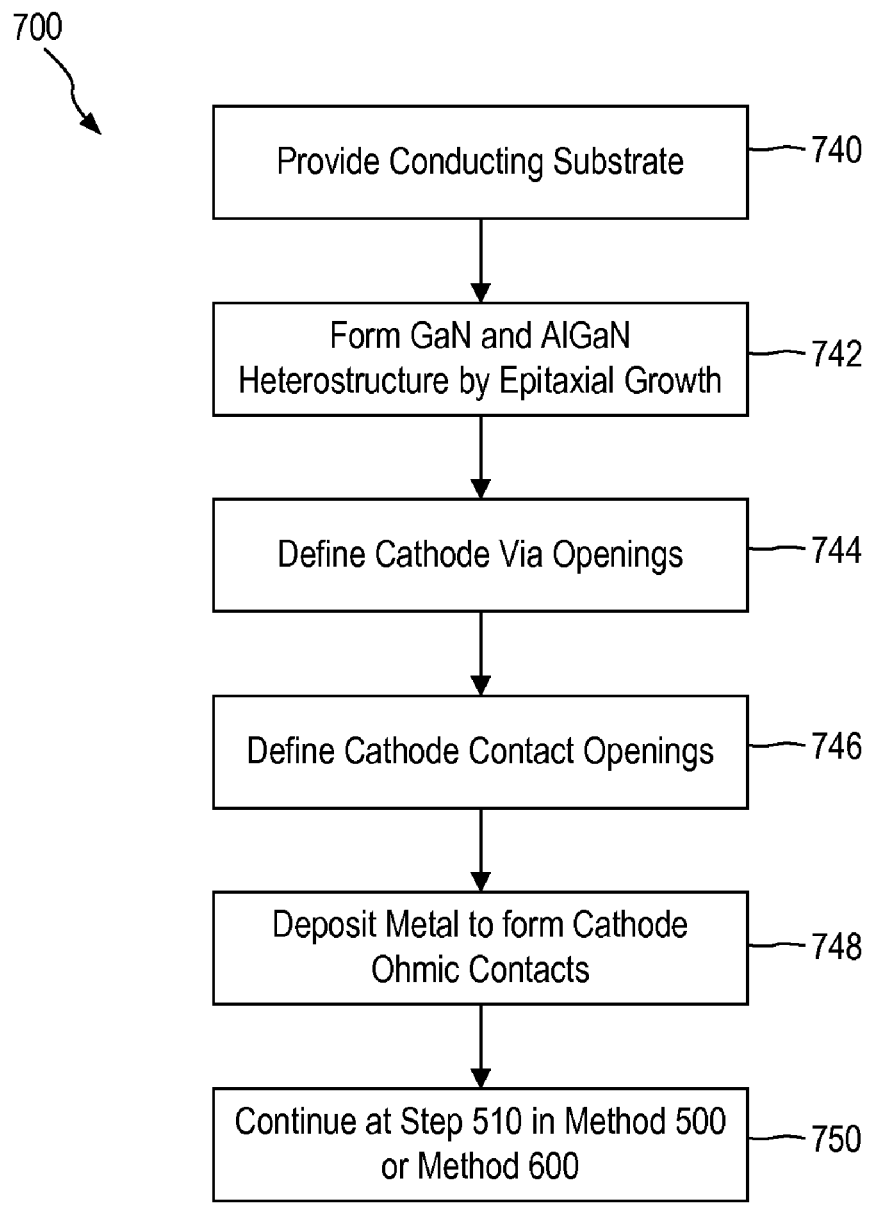
FIG. 8 is a flow chart illustrating the fabrication process for forming via structures to a conductive substrate in the GaN heterojunction Schottky diode of FIGS. 4 and 5 according to one embodiment of the present invention.

In the case where a conducting substrate is used, such as in GaN diodes 300 and 400 in FIGS. 4 and 5, method 700 of FIG. 8 is used. Referring to FIG. 8, a conducting substrate is provided (step 740). Then, the GaN/AlGaN heterostructure is formed on the conductive substrate, such as by epitaxial growth (step 742). Via openings are defined in the AlGaN/GaN structure all the way down to the conducting substrate 403 (step 744). Cathode contact openings are also defined in the AlGaN/GaN structure (step 746). Metal deposition is then carried out to fill the via openings and the contact openings to form Cathode ohmic contacts (step 748). Method 700 then returns to step 510 of method 500 or method 600 to continue the remaining processing steps of the GaN Schottky diode (step 750).

The fabrication process described above is illustrative only and one of ordinary skill in the art, upon being apprised of the present invention, would appreciate that other fabrication process steps can be used to form the GaN Schottky diode of the present invention with high barrier regions and/or with dielectric field plate structures to suppress electric field crowding at the anode electrode edge, thereby increasing the breakdown voltage of the GaN Schottky diode.

In one embodiment, the high barrier region has a thickness that does not exceed the thickness of the AlGaN layer so as not to interfere with the two-dimensional electron gas layer. Typically, the thickness of the AlGaN layer is about 20 nm and thus the thickness of the high barrier region should be less than 20 nm.

The above detailed descriptions are provided to illustrate specific embodiments of the present invention and are not intended to be limiting. Numerous modifications and variations within the scope of the present invention are possible. The present invention is defined by the appended claims.

I claim:

1. A gallium nitride based semiconductor diode, comprising:
   a substrate;
   a GaN layer formed on the substrate;
   an AlGaN layer formed on the GaN layer, the GaN layer and the AlGaN layer forming a cathode region of the diode;
   a metal layer formed on the AlGaN layer forming a Schottky junction therewith, the metal layer forming an anode electrode of the diode; and
   a high barrier region formed in the top surface of the AlGaN layer and positioned under an edge of the metal layer, the high barrier region having a higher bandgap energy than the AlGaN layer or being more resistive than the AlGaN layer.

2. The diode of claim 1, wherein the high barrier region comprises AlGaN layer implanted with Mg, Cd, Zn, Ca, N, O, C, Ar or a silicon oxide layer.

3. The diode of claim 1, further comprising a dielectric layer formed on the AlGaN layer, the dielectric layer having an opening in which the metal layer is formed as the anode electrode.

4. The diode of claim 3, wherein the high barrier region extends from underneath the dielectric layer, pass the edge of the metal layer and extends partially underneath the anode electrode.

5. The diode of claim 1, wherein the substrate comprises an insulating substrate.

6. The diode of claim 1, wherein the substrate comprises a conducting substrate.

7. The diode of claim 6, further comprising:
   an ohmic contact formed in the GaN layer and the AlGaN layer, the ohmic contact forming a cathode electrode; and
   a via formed in the GaN layer and the AlGaN layer for electrically connecting the ohmic contact to the conducting substrate.

8. The diode of claim 1, wherein the substrate is formed of a material selected from sapphire, ZnO, AN, GaN, SiC or glass.

9. The diode of claim 3, further comprising:
   a field plate structure formed in the dielectric layer and surrounding the metal layer at an metal layer to AlGaN layer interface, the field plate structure comprising an extension of the dielectric layer at reduced thickness where the field plate structure extends into the metal layer at the metal layer to AlGaN layer interface.

10. The diode of claim 1, wherein the high barrier region comprises a first high barrier region and a second high barrier region positioned under a first edge and a second edge, respectively, of the metal layer, and the metal layer comprises a first metal layer positioned between an inner boundary of the first high barrier region and the inner boundary of the second high barrier region, and a second metal layer formed on top of and enclosing the first metal layer.

11. The diode of claim 10, wherein the first metal layer and the second metal layer are formed of the same Schottky metal.

12. The diode of claim 10, wherein the first metal layer is formed of a first Schottky metal and the second metal layer is formed of a second Schottky metal, the first Schottky metal having a lower Schottky barrier height than the second Schottky metal.

13. The diode of claim 1, wherein the high barrier region is formed by ion-implantation into the AlGaN layer, diffusion into the AlGaN layer, or plasma exposure.

14. The diode of claim 7, further comprising:
   a field plate structure formed in the dielectric layer and surrounding the metal layer at an metal layer to AlGaN layer interface, the field plate structure comprising an extension of the dielectric layer at reduced thickness where the field plate structure extends into the metal layer at the metal layer to AlGaN layer interface.

* * * * *

UNITED STATES PATENT AND TRADEMARK OFFICE
CERTIFICATE OF CORRECTION

| | | |
|---|---|---|
| PATENT NO. | : 7,842,974 B2 | Page 1 of 1 |
| APPLICATION NO. | : 12/388390 | |
| DATED | : November 30, 2010 | |
| INVENTOR(S) | : TingGang Zhu | |

It is certified that error appears in the above-identified patent and that said Letters Patent is hereby corrected as shown below:

Column 8
Claim 8, Line 36, where "AN" should read --AlN--.

Signed and Sealed this
Fifteenth Day of March, 2011

David J. Kappos
*Director of the United States Patent and Trademark Office*